United States Patent
Gass et al.

(10) Patent No.: US 7,895,490 B2
(45) Date of Patent: Feb. 22, 2011

(54) METHOD AND SYSTEM FOR TESTING AN ELECTRONIC CIRCUIT TO IDENTIFY MULTIPLE DEFECTS

(75) Inventors: Benjamin Robert Gass, Pflugerville, TX (US); Abel Alaniz, Cedar Park, TX (US); Asher Shlomo Lazarus, Austin, TX (US); Timothy M. Skergan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 284 days.

(21) Appl. No.: 12/123,547

(22) Filed: May 20, 2008

(65) Prior Publication Data

US 2009/0292964 A1 Nov. 26, 2009

(51) Int. Cl.
G01R 31/28 (2006.01)

(52) U.S. Cl. .................. 714/732; 714/726; 714/733

(58) Field of Classification Search .................. None
See application file for complete search history.

(56) References Cited

U.S. PATENT DOCUMENTS

| | | | | |
|---|---|---|---|---|
| 4,503,537 A * | 3/1985 | McAnney | .................. | 714/728 |
| 5,173,906 A | 12/1992 | Dreibelbis et al. | | |
| 6,021,514 A * | 2/2000 | Koprowski | .................. | 714/733 |
| 6,393,594 B1 * | 5/2002 | Anderson et al. | ........... | 714/738 |
| 6,442,720 B1 * | 8/2002 | Koprowski et al. | .......... | 714/726 |
| 6,516,432 B1 * | 2/2003 | Motika et al. | ............... | 714/732 |
| 6,643,807 B1 | 11/2003 | Heaslip et al. | | |
| 6,901,542 B2 * | 5/2005 | Bartenstein et al. | ......... | 714/719 |
| 6,961,886 B2 * | 11/2005 | Motika et al. | ............... | 714/732 |
| 6,978,408 B1 | 12/2005 | Huott et al. | | |
| 7,076,706 B2 | 7/2006 | Eckelman et al. | | |
| 7,475,311 B2 * | 1/2009 | Kiryu | .......................... | 714/732 |
| 7,607,059 B2 * | 10/2009 | Osanai | ....................... | 714/729 |
| 2002/0125907 A1 * | 9/2002 | Kurtulik et al. | ............. | 324/765 |
| 2003/0115525 A1 | 6/2003 | Hill et al. | | |
| 2003/0149925 A1 * | 8/2003 | Angelotti et al. | ........... | 714/726 |
| 2004/0216061 A1 | 10/2004 | Floyd et al. | | |
| 2005/0160339 A1 * | 7/2005 | Forlenza et al. | ............. | 714/733 |
| 2005/0222816 A1 * | 10/2005 | Cheng et al. | ................. | 702/185 |
| 2006/0236181 A1 * | 10/2006 | Kiryu | .......................... | 714/733 |
| 2007/0011537 A1 * | 1/2007 | Kiryu | .......................... | 714/733 |
| 2007/0050693 A1 * | 3/2007 | Kiryu | .......................... | 714/733 |
| 2007/0061637 A1 | 3/2007 | Ward et al. | | |
| 2007/0101194 A1 | 5/2007 | Lockwood et al. | | |
| 2007/0168803 A1 * | 7/2007 | Wang et al. | ................. | 714/726 |
| 2007/0220383 A1 * | 9/2007 | Kiryu | .......................... | 714/726 |
| 2008/0091997 A1 * | 4/2008 | Osanai | ....................... | 714/727 |
| 2009/0089636 A1 * | 4/2009 | Fernsler et al. | ............. | 714/728 |

* cited by examiner

*Primary Examiner*—Jeffrey A Gaffin
*Assistant Examiner*—Guerrier Merant
(74) *Attorney, Agent, or Firm*—Patrick E. Caldwell, Esq.; The Caldwell Firm, LLC

(57) ABSTRACT

A method for testing an electronic circuit comprises selecting a plurality of test patterns arranged in an order. The method tests an electronic circuit by applying to the electronic circuit a first subset range of the plurality of test patterns sequentially in the order, from a first test pattern to a first log interval after the first test pattern, thereby generating a first associated output. The method compares the first associated output with a first known output of the plurality of known outputs. In the event the first associated output does not match the first known output, the method stores indicia of the first mismatch; causes the electronic circuit to appear to assume the first known output state; and proceeds with additional test procedures.

20 Claims, 3 Drawing Sheets

METHOD AND SYSTEM FOR TESTING AN ELECTRONIC CIRCUIT TO IDENTIFY MULTIPLE DEFECTS

TECHNICAL FIELD

The present invention relates generally to the field of computer testing and performance and, more particularly, to a system and method for testing an electronic circuit.

BACKGROUND OF THE INVENTION

Modern electronic devices, such as microprocessors, often include a complex matrix of logic gates and other circuitry arranged to perform particular tasks and functions. These logic gates are often interconnected in two parallel arrangements, one arrangement for operation, and another arrangement for testing the functionality of the circuit. Linking a plurality of latches together into a "scan chain" is one popular method of arranging logic units for functional/operational testing. Grouping components into groups of "stumps" is another popular method of arranging logic units for functional/operational testing. One skilled in the art will appreciate that there are a wide variety of ways to arrange circuit components to facilitate testing. As used herein, "stump" or "stumps" refers generally to an arrangement of logic units or other circuits coupled together for testing.

One popular approach to testing circuits is to apply a number of test patterns to a device under test (DUT), as a whole or divided into stumps, comparing the resultant output with a known good output for that test pattern. One skilled in the art will appreciate that there are a wide variety of systems and methods for generating test patterns that provide inputs to the DUT that help identify DUT faults or malfunctions.

One popular mechanism for generating and applying test patterns to a DUT is the logic built-in self-test (LBIST) approach. Generally, in LBIST testing, a user creates an LBIST test pattern that causes the DUT to run N number of internally-generated pseudo-random LBIST patterns on itself, compressing the results into multiple input shift registers (MISRs), described in more detail below. As used herein, an "LBIST pattern" is one of a plurality of test patterns generated by the DUT in response to an "LBIST test pattern."

As the number and complexity of circuit components and circuits in modern electronic devices has grown, so have the number of LBIST patterns required to analyze a chip, and the time required to set up, apply, and analyze the MISR outputs the LBIST patterns generate. For example, it is not unusual for an LBIST test run to apply on the order of 2 million or more LBIST patterns. A large number of LBIST patterns increases the time required to identify "failing patterns," that is, LBIST patterns that cause MISR outputs that do not match a known output, which indicates that the DUT does not function in the manner expected for the associated LBIST test pattern.

In conventional LBIST systems, the DUT includes a pseudo-random pattern generator (PRPG) that generates the LBIST patterns based on the "seed" LBIST test pattern. As such, most conventional LBIST patterns are arranged in a particular order (the deterministic PRPG order), and typical systems apply the LBIST patterns to the DUT in that order. In particular, for each LBIST pattern, typical systems clock in the current LBIST pattern to the DUT, perform a functional clock cycle, and clock out the resultant DUT state (the "output") to the MISRs. The MISRs compress the output into a "signature."

Because of the nature of the output capture MISRs, a DUT state output that deviates from the expected output for a given LBIST pattern, corrupts the MISR outputs (the signatures) for subsequent LBIST patterns. And the corrupted subsequent signatures look like failing LBIST patterns. Therefore, many typical conventional test systems employ a "binary search" approach to identifying failing LBIST patterns.

The binary search approach is well known to those skilled in the art and generally consists of dividing the number of applied LBIST patterns into narrower and narrower halves, until the process identifies the first failing LBIST pattern. This approach, however, requires a binary search of $\log_2(N)$ iterations to find a failing LBIST pattern, where N is the number of LBIST patterns. For example, for a DUT tested with 1M (million) LBIST patterns, where the $264{,}001^{st}$ LBIST pattern fails, a typical test system would run the first 1M LBIST patterns, which would indicate a failure in some LBIST pattern before the one millionth LBIST pattern. The system runs the series of LBIST patterns again, this time running only the first 500 thousand LBIST patterns, which is one-half of the full run. The $500{,}000^{th}$ LBIST pattern MISR output does not match the known output, and so the system now knows that the failing LBIST pattern is in the first half of the sequence of LBIST patterns.

The system next runs the first 250 thousand LBIST patterns, after which, the MISR output does match the expected output. The system now knows that the failing LBIST pattern is between the $250{,}001^{st}$ and the $499{,}999^{th}$ LBIST pattern. The system then runs the first 275,000 LBIST patterns (which fails), then the first 262,500 LBIST patterns (which passes), then the first 268,750 (which fails), and so forth, narrowing the change in search range until the system finds the failing $264{,}001^{st}$ LBIST pattern. As described above, this standard binary search approach can identify a failing LBIST pattern in $O(\log_2(N))$ time.

The standard binary search time is not inherently unreasonable, particularly for small numbers of LBIST patterns. However, as the number of LBIST patterns required to properly test a DUT increases, the search time for a standard binary search becomes too long to be practical, especially as compared to the decreasing time window available during the manufacturing process.

In cases where there are two (or more) faults in the DUT, causing for example, a failing LBIST pattern each "half" of the total LBIST patterns, traditional methods will find the first failing pattern before the second failing pattern. After the fault causing the first failing pattern has been addressed, subsequent testing discovers the second failing pattern.

Therefore, there is a need for a system and/or method for testing an electronic circuit for multiple faults that addresses at least some of the problems and disadvantages associated with conventional systems and methods.

BRIEF SUMMARY

The following summary is provided to facilitate an understanding of some of the innovative features unique to the embodiments disclosed and is not intended to be a full description. A full appreciation of the various aspects of the embodiments can be gained by taking into consideration the entire specification, claims, drawings, and abstract as a whole.

The aforementioned aspects and other objectives and advantages can now be achieved as described herein. A method for testing an electronic circuit comprises selecting a plurality of test patterns arranged in an order, wherein each test pattern is associated with an associated circuit input state, and each test pattern causes an associated output of an electronic circuit. The method selects a first log interval. The method stores a plurality of known outputs, wherein the plurality of known outputs comprises a known output associated with each test pattern as applied to an electronic circuit functioning in a known state. The method tests an electronic circuit in a first test by applying to the electronic circuit a first subset range of the plurality of test patterns sequentially in the order, from a first test pattern to the first log interval after the first test pattern, thereby generating a first associated output. The method compares the first associated output with a first known output of the plurality of known outputs, wherein the first known output is associated with the same test pattern as the first associated output. In the event the first associated output matches the first known output, the method proceeds with additional test procedures. In the event the first associated output does not match the first known output, the method stores indicia of the mismatch; causes the electronic circuit to appear to assume the known output state; and proceeds with additional test procedures.

In an alternate embodiment, a system comprises a test engine configured to couple to a device under test (DUT), the DUT comprising a plurality of test stumps. The test engine generates a plurality of test patterns arranged in an order, wherein each test pattern is associated with an associated circuit input state, and each test pattern causes an associated output of the DUT. The test engine applies to the electronic circuit a first subset range of the plurality of test patterns sequentially in the order, from a first test pattern to a first log interval after the first test pattern, thereby generating a first associated output. A trace array coupled to the DUT stores a plurality of known outputs, wherein the plurality of known outputs comprises a known output associated with each test pattern as applied to an electronic circuit configured similar to the DUT and functioning in a known state. A controller coupled to the test engine and the trace array compares the first associated output with a first known output of the plurality of known outputs, wherein the first known output is associated with the same test pattern as the first associated output. In the event the first associated output matches the first known output, the test engine proceeds with additional test procedures. In the event the first associated output does not match the first known output, the test engine stores indicia of the first associated output; causes the electronic circuit to appear to assume the associated circuit input state associated with the test pattern associated with the first known output; and proceeds with additional test procedures.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1:
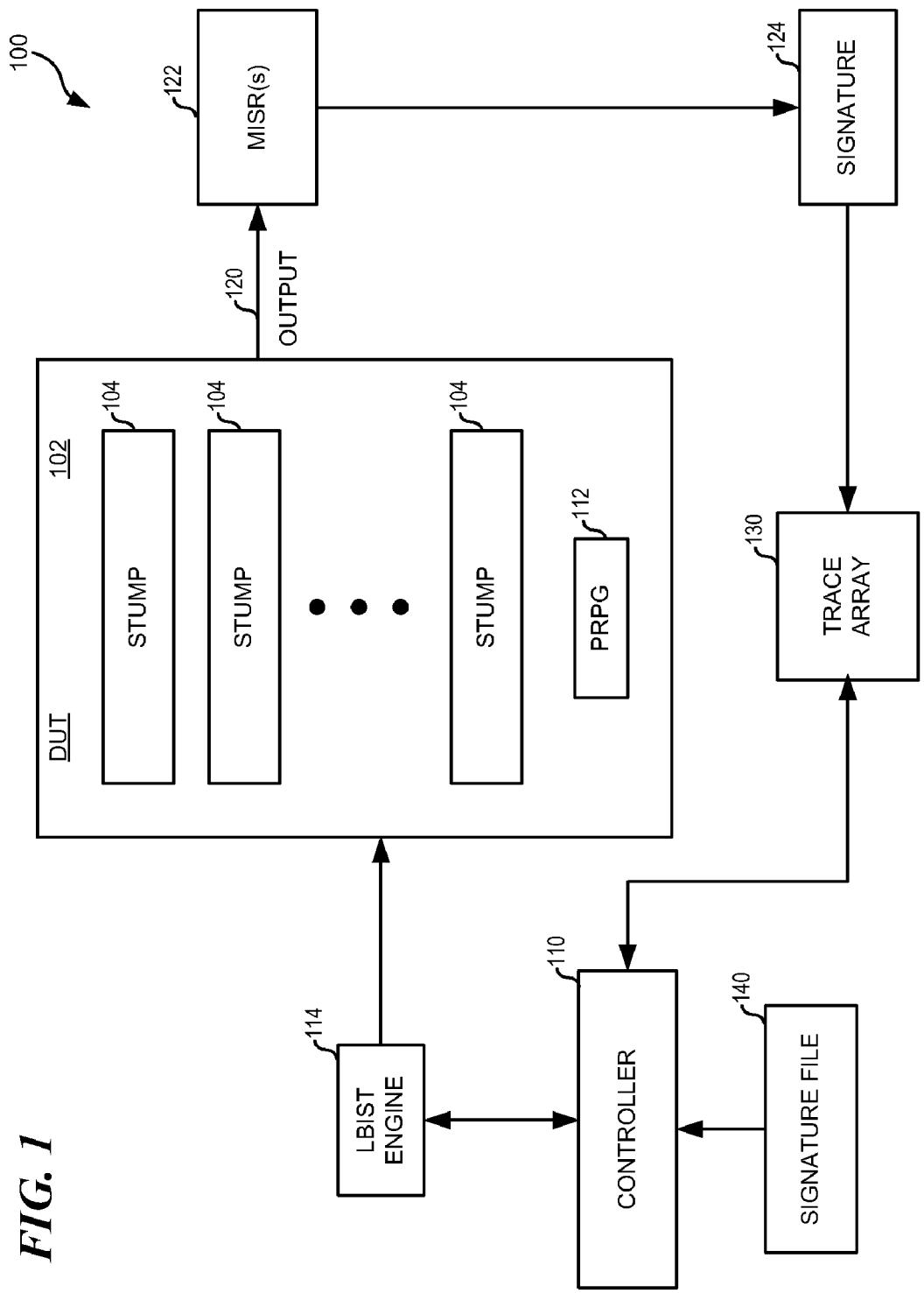
FIG. 1 illustrates a block diagram showing an improved electronic circuit test system in accordance with a preferred embodiment.

The particular values and configurations discussed in these non-limiting examples can be varied and are cited merely to illustrate at least one embodiment and are not intended to limit the scope of the invention.

In the following discussion, numerous specific details are set forth to provide a thorough understanding of the present invention. Those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or in some combinations thereof. In a preferred embodiment, however, the functions are performed by a processor such as a computer or an electronic data processor in accordance with code such as computer program code, software, and/or integrated circuits that are coded to perform such functions, unless indicated otherwise.

The invention can take the form of an entirely hardware embodiment, an entirely software embodiment, or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus or otherwise tangible medium that can contain, store, communicate, propagate, or transport the program for use by or in connection with the instruction execution system, apparatus, or device.

The medium can be an electronic, magnetic, optical, electromagnetic, infrared, or semiconductor system (or apparatus or device). Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

Referring now to the drawings, FIG. 1 is a high-level block diagram illustrating certain components of a system 100 for an improved method and system for testing an electronic circuit, in accordance with a preferred embodiment of the present invention. System 100 includes a device under test (DUT) 102.

Generally, DUT 102 is the circuit or chip to be tested. Many modern circuits include a number of scan chains or stumps, and as such, DUT 102 includes a plurality of stumps 104. Very generally, system 100 applies an LBIST test pattern to DUT 102, which generates a plurality of LBIST patterns, applying the LBIST patterns to one or more of stumps 104. One or more MISRs 122 compact each output 120 of DUT 102 that results from that application into a signature 124.

More specifically, system 100 includes a controller 110. Controller 110 is an otherwise conventional controller, configured as described below. Controller 110 couples to LBIST engine 114. LBIST engine 114 is an otherwise conventional LBIST engine. Generally, LBIST engine 114 generates an LBIST test pattern based on user input, for transmission to DUT 102 in accordance with commands received from controller 110. One skilled in the art will understand that applying an LBIST test pattern to DUT 102 causes DUT 102 to produce outputs, indicated in FIG. 1 as output 120. In the illustrated embodiment, LBIST engine 114 couples to DUT 102 and is depicted as a separate block from DUT 102 for ease of illustration. In one embodiment, LBIST engine 114, DUT 102, MISRs 122, and trace array 130 (described below) all reside on a common chip.

DUT 102 includes a pseudo-random pattern generator (PRPG) 112. PRPG 112 is an otherwise conventional pseudo-random pattern generator, configured to generate a plurality of ordered pseudo-random LBIST patterns in response to an LBIST test pattern received from LBIST engine 114. Generally, the LBIST patterns generated by PRPG 112 are configured, collectively, to test for a wide variety of problems and faults of one or more stumps 104 of DUT 102. For convenience, as used herein, "LBIST patterns" means the pseudo-random patterns generated by PRPG 112 in response to an LBIST test pattern.

It is often more convenient to compress or compact raw output from DUT 102 into a data signature. As illustrated, system 100 includes MISR(s) 122. Generally, MISR(s) 122 are one or more multiple-input shift registers (MISRs) or other suitable data compactor. MISR 122 couples to DUT 102 to receive raw output from DUT 102 (in response to LBIST pattern stimuli), and to compact the raw output into signatures 124. There are a variety of well-known approaches to compacting raw DUT output into a signature.

As illustrated, system 100 includes a trace array 130 coupled to MISR 122 so as to receive one or more of the signatures 124. Trace array 130 is an otherwise conventional trace array modified as described herein. In one embodiment, trace array 130 is an otherwise conventional array, preexisting on DUT 102. In a preferred embodiment, trace array 130 is configured to be wide enough to hold a complete MISR signature in each entry, and to contain a suitable number of entries. In one embodiment, trace array 130 includes 128 entries. Trace array 130 also couples to controller 110. In one embodiment, controller 110 reads the data in trace array 130. In an alternate embodiment, DUT 102 transmits the data in trace array 130 to controller 110.

System 100 also includes a signature file 140. Generally, signature file 140 is an otherwise conventional signature file, and can comprise a storage structure, hardware storage, an abstract data structure, or other suitable configuration. In one embodiment, signature file 140 stores a known good signature output for each test pattern applied to DUT 102. In an alternate embodiment, signature file 140 stores a plurality of known good signature outputs for a plurality of LBIST patterns.

Figure 2:
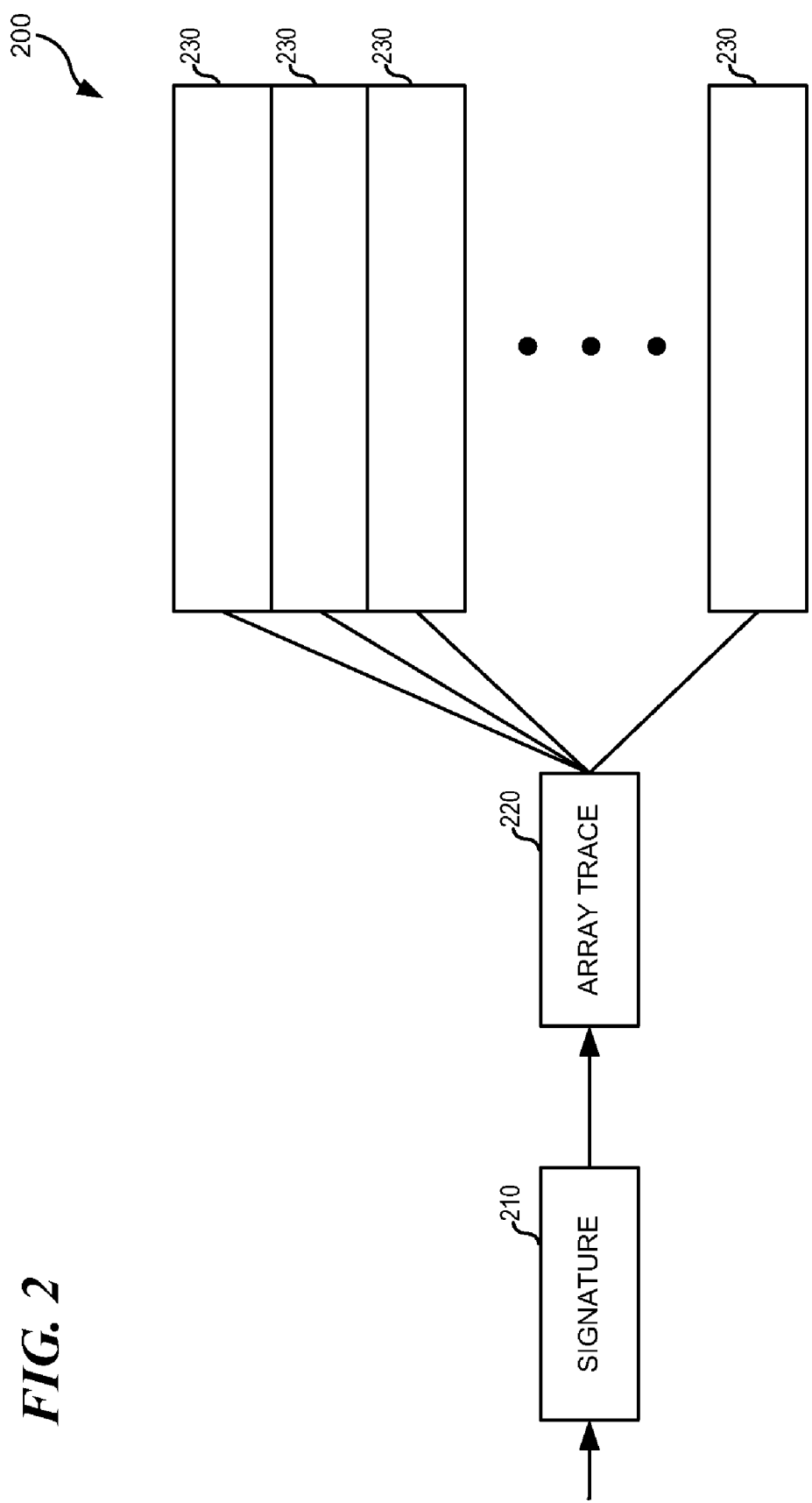
FIG. 2 illustrates a block diagram showing an improved electronic circuit test system in accordance with a preferred embodiment.

Therefore, generally, in one embodiment, controller 110 directs LBIST engine 114 to apply an LBIST test pattern to DUT 102, from which PRPG 112 of DUT 102 generates LBIST patterns for application to one or more stumps 104. In response to the applied LBIST patterns, DUT 102 provides outputs 120 to MISR 122, which compacts the outputs 120 into signatures 124. As described in more detail below, trace array 130 stores a plurality of known good signatures from signature file 140, for comparison with a subset of the signatures 124. FIG. 2 provides additional detail of trace array 130.

FIG. 2 is a high-level block diagram illustrating certain components of a system 200 for an improved method and system for testing an electronic circuit, in accordance with a preferred embodiment of the present invention. System 200 includes a trace array 220. Trace array 220 is an otherwise conventional memory array, configured as described below.

Generally, trace array 220 includes a plurality of entries 230. In one embodiment, trace array 220 includes M entries, where M is an integer power of 2. As illustrated, trace array 220 receives a signature 210 and stores the received signature into an empty entry 230. In one embodiment, trace array 220 is a predetermined array selected from among a plurality of preexisting arrays of the DUT. System 200 operates as a part of system 100 of FIG. 1.

Figure 3:
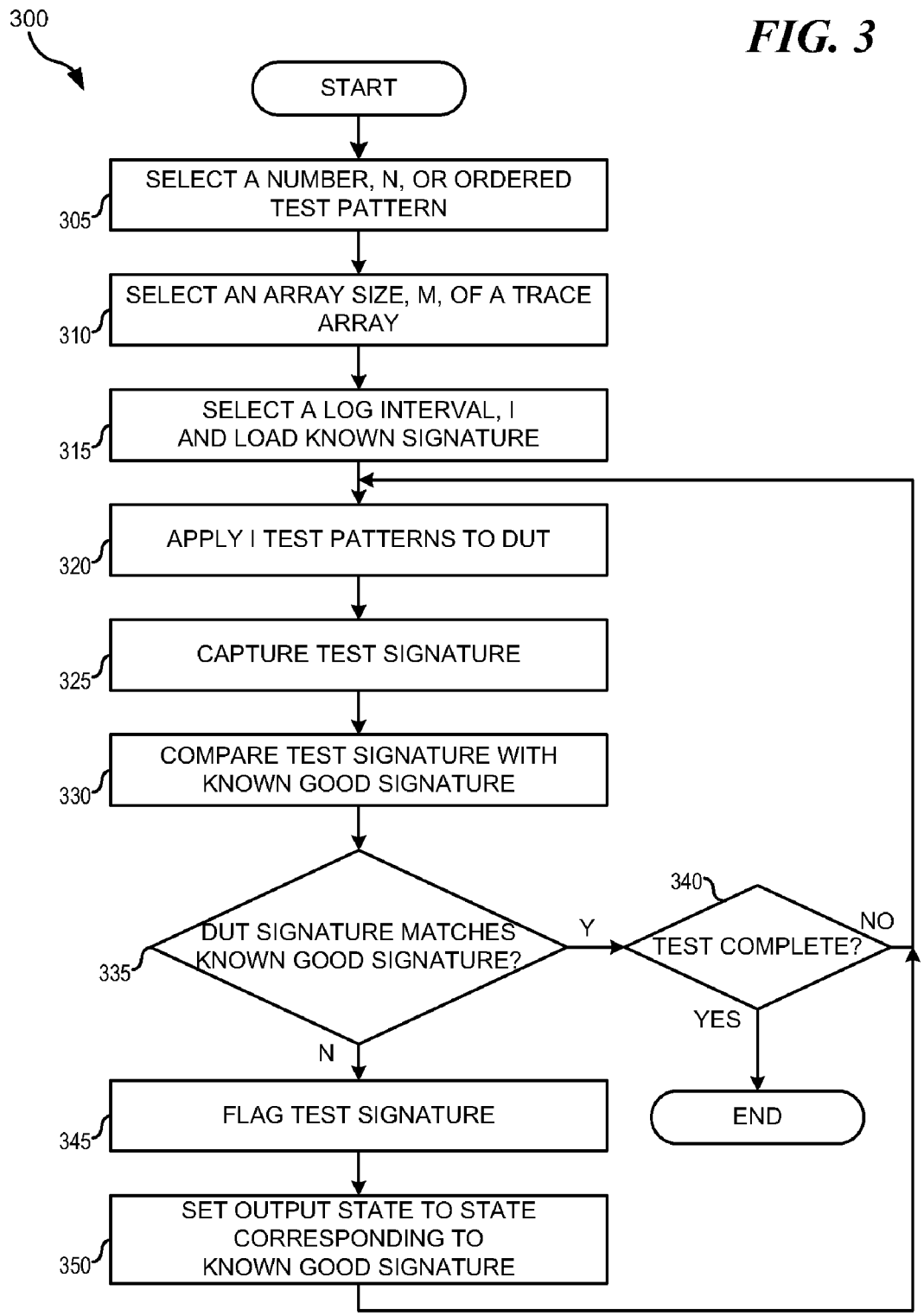
FIG. 3 illustrates a high-level flow diagram depicting logical operational steps of an improved electronic circuit test method, which can be implemented in accordance with a preferred embodiment.

More particularly, system 100 operates as described with reference to FIG. 3. FIG. 3 illustrates one embodiment of a method for testing an electronic circuit. Specifically, FIG. 3 illustrates a high-level flow chart 300 that depicts logical operational steps performed by, for example, system 100 of FIG. 1, which may be implemented in accordance with a preferred embodiment.

As indicated at block 305, the process begins, wherein a controller selects a number, N, of ordered LBIST patterns. For example, controller 110 selects N LBIST patterns from PRPG 112. In one embodiment, controller 110 selects N LBIST patterns based on input from a user. Next, as illustrated at block 310, a controller selects an array size, M, of a trace array. For example, controller 110 selects an array size M of trace array 130. In one embodiment, M is the number of entries 230 of trace array 220 of FIG. 2. In an alternate embodiment, controller 110 selects a subset M of the numbers of entries in the trace array.

Next, as illustrated at block 315, a controller selects a log interval, I. For example, in one embodiment, controller 110 selects the log interval I as 1/M of the N LBIST patterns. In an alternate embodiment, controller 110 selects the log interval I based on input received from a user. Also illustrated at block 315, a controller loads known signatures into the trace array based on the log interval I and the array size M. For example, in one embodiment, controller 110 loads a known good signature for every $I^{th}$ LBIST pattern, up to and including M known signatures.

Next, as illustrated at block 320, a controller applies the first I LBIST patterns to a device under test (DUT). For example, controller 110 directs test engine 114 to apply LBIST patterns 0 to I to DUT 102. In an alternate embodiment, the DUT itself applies LBIST patterns 0 to I. Next, as illustrated at block 325, a controller captures an output signature produced by DUT 102 in response to the applied LBIST patterns. In one embodiment, MISR 122 captures output 120 and generates output signature 124.

Next, as illustrated at block 330, a controller compares the captured LBIST pattern output signature with the corresponding known good signature in the trace array. For example, controller 110 compares the output signatures 124 with the associated known good output signature stored in trace array 130.

Next, as illustrated at decisional block 335, a controller determines whether the captured LBIST pattern output signature matches its corresponding associated known good signature. For example, controller 110 determines whether the captured LBIST pattern signature matches its corresponding known good signature in trace array 130, based on the comparison illustrated at block 330. Generally, a mismatch indicates a fault somewhere in the DUT.

If at block 335 the captured LBIST pattern signature matches its corresponding known good signature in trace array 130, the process follows the YES branch to decisional block 340. As illustrated at decisional block 340, a controller determines whether testing is complete. In one embodiment, test engine 114 determines whether it has applied N LBIST patterns to DUT 102. If at block 340 testing is complete, the process follows the YES branch and the process ends. If at block 340 testing is not complete, the process follows the NO branch, returning to block 320, wherein the controller applies the next I LBIST patterns to the DUT.

If at block 335 the captured LBIST pattern signature does not match its corresponding known good signature in trace array 130, the process follows the NO branch to block 345. As illustrated at block 345, a controller flags the captured LBIST pattern signature as indicating a failing pattern.

Next, as illustrated at block 350, the controller sets the DUT output state to a state corresponding to the known good signature state. In one embodiment, the controller sets the DUT state to appear to assume the circuit state associated with the known good output signature state. In an alternate embodiment, the controller sets the MISR inputs (the DUT output) to correspond with the outputs of the known good signature state. In an alternate embodiment, the controller sets the DUT state to the known good circuit state associated with the known good signature.

Next, the process returns to block 320, wherein the controller applies the next I LBIST patterns to the DUT. Thus, in one embodiment, the test system described herein resets the MISR state such that the deviating LBIST pattern output does not also cause subsequent LBIST pattern outputs beyond the test interval I to deviate from the expected output. Instead, the test system restores the MISR state to the state it would have been in had the previous interval's LBIST pattern outputs conformed to the expected output signatures. As such, the test system can identify whether more than one LBIST pattern output deviates from the known or expected output signatures.

For example, for a DUT tested with 1 million LBIST patterns, where the 264,004$^{th}$ LBIST pattern fails, and the 604,094$^{th}$ LBIST pattern fails, N is 1 million. For a trace array with 10 available entries, M is 10. The test system loads the known good signatures for a known good DUT into the trace array. In an embodiment where I is 100,000, the test system loads the known good signatures corresponding to LBIST patterns 100,000, 200,000, 300,000, 400,000, 500,000, 600,000, 700,000, 800,000, 900,000, and 1,000,000.

The text system runs the first 100,000 LBIST patterns and compares the LBIST pattern output signature with the known good signature in the trace array. If the LBIST pattern output matches, which in this example it does, the test system runs the next 100,000 LBIST patterns. In this example, the LBIST pattern output signature after the next 100,000 LBIST patterns also corresponds with the known good signature, and the test system runs the next 100,000 LBIST patterns.

The next interval of LBIST patterns, patterns 200,001 to 300,000, includes the first failing LBIST pattern 264,004. When the test system compares the LBIST pattern output signature after LBIST pattern 300,000, that output signature does not match the known good output signature corresponding to the first 300,000 LBIST patterns. At this point in a conventional system (except in rare circumstances), every subsequent output signature would also diverge from the known good signature, obscuring the second failing LBIST pattern.

The test system flags the failing interval of LBIST patterns. As described above, in one embodiment, the test system stores the output signature in the trace array entry previously occupied by the known good signature, and sets a flag indicating that that entry now holds a divergent output signature. In an alternate embodiment, the test system sets a "fail" flag in a register corresponding to the M intervals of LBIST patterns.

The test system next sets the MISRs to produce the known good signature, as if the current LBIST pattern output did not diverge from the expected output. In one embodiment, the test system seeds the MISRs with inputs known to produce the known good signature. In an alternate embodiment, the test system configures the MISRs with the known good signature itself. Thus, generally, in one embodiment, the test system prepares the MISRs to receive the DUT outputs generated by application of the next LBIST pattern, so as to produce an output signature that matches the known good output signature of the next LBIST pattern, if the next LBIST pattern does not also fail.

The test system applies the next interval of LBIST patterns, which in this example includes patterns 300,001 to 400,000. The resultant output signature does not diverge from the known good output signatures, and the test engine continues processing LBIST patterns through pattern 600,000.

The next interval of LBIST patterns, patterns 600,001 to 700,000, includes the second failing LBIST pattern 604,094. When the test system compares the LBIST pattern output signature after LBIST pattern 700,000, that output signature does not match the known good output signature corresponding to the first 700,000 (non-failing) LBIST patterns. As described above, the test system flags the failing interval of LBIST patterns and sets the MISRs to produce the known good signature, as if the current LBIST pattern output did not diverge from the expected output.

The test system applies the next interval of LBIST patterns, which in this example includes patterns 700,001 to 800,000. The resultant output signature does not diverge from the known good output signatures, and the test engine continues processing LBIST patterns through the remaining LBIST patterns, which likewise match the known good signature.

Thus, by the technique described above, the test system identifies more than one failing LBIST pattern in a single LBIST test run. As such, a test engineer reviewing the results of the test above would, for example, observe that the third and sixth pattern intervals are flagged as failing. Thus, the test engineer knows that there are multiple failing LBIST patterns, and can configure subsequent test runs accordingly. Further, by careful selection of the interval I, the test engineer can identify a significant number of the failing LBIST patterns, thereby reducing diagnostic time. Awareness of multiple failing LBIST patterns also helps the test engineer to design solutions that can be optimized in ways unavailable in conventional approaches.

Accordingly, the disclosed embodiments provide numerous advantages over other methods and systems. For example, the disclosed embodiments generally identify failing LBIST patterns in fewer steps than conventional methods, by identifying more than one failing LBIST pattern in a single test run. Further, the embodiments described herein provide a significant reduction in the number of tests needed to search for failing test patterns.

For example, in general, the number of LBIST tests needed to isolate N failing patterns over P total patterns is $(\log_2(P)+\log_2(P-F(1))+\ldots+\log_2(P-F(N)))$, where $F(X)$ is the number of patterns eliminated by finding the $X^{th}$ failing pattern. For evenly distributed failing patterns, the number of patterns to search for each fail is $(P-((N/P)*X))$. For large N, this reduction is small for each fail, and a binary search looses efficiency. In conventional systems, the maximum number of tests required to isolate each failing pattern is P. The test system described herein reduces the number of tests required by a factor of $\log_2(M)$.

Thus, the test system described herein provides a significant reduction in the number of tests needed for each fail, with a maximum of P/M tests needed. For example, where P=10,000 and M=256, the maximum number of tests required to find each failing pattern is only 40. For 10,000 patterns, a typical number of fails could easily be over 500, which in conventional systems would take at least 513 tests to isolate. As such, the test system described herein greatly reduces test time required to isolate failing LBIST patterns.

Further, the disclosed embodiments offer methods to implement these improved techniques with a minimum of additional hardware. In one embodiment, the novel method can be implemented readily using a suitably configured trace array, which can provide significant benefits with only moderate cost increases. The reduced test times required to identify failing LBIST patterns also provides cost saving benefits and reduced manufacturing testing. One skilled in the art will note other significant advantages that are readily apparent.

One skilled in the art will appreciate that variations of the above-disclosed and other features and functions, or alternatives thereof, may be desirably combined into many other different systems or applications. Additionally, various presently unforeseen or unanticipated alternatives, modifications, variations or improvements therein may be subsequently made by those skilled in the art, which are also intended to be encompassed by the following claims.

What is claimed is:

1. A method for testing an electronic circuit, comprising:
   selecting a plurality of test patterns arranged in an order, wherein each test pattern is associated with an associated circuit input state, and each test pattern causes an associated output of an electronic circuit;
   selecting a first log interval;
   storing a plurality of known outputs, wherein the plurality of known outputs comprises a known output associated with each test pattern as applied to the electronic circuit functioning in a known state;
   testing the electronic circuit in a first test by applying to the electronic circuit a first subset range of the plurality of test patterns sequentially in the order, from a first test pattern to the first log interval after the first test pattern, thereby generating a first associated output;
   comparing the first associated output with a first known output of the plurality of known outputs, wherein the first known output is associated with the same test pattern as the first associated output;
   in the event the first associated output matches the first known output, proceeding with additional test procedures; and
   in the event the first associated output does not match the first known output:
   storing indicia of the first associated output;
   modifying the first associated output to match the first known output; and
   proceeding with additional test procedures.

2. The method of claim 1, wherein proceeding with additional test procedures comprises:
   in the event a last-run test pattern is not a last test pattern in the plurality of test patterns:
   testing the electronic circuit in a second test by:
   applying to the electronic circuit a second subset range of the plurality of test patterns sequentially in the order, from a first test pattern after a last-run test pattern to the first log interval after the first test pattern, thereby generating a second associated output;
   comparing the second associated output with a second known output of the plurality of known outputs, wherein the second known output is associated with the same test pattern as the second associated output;
   in the event the second associated output matches the second known output, proceeding with additional test procedures; and
   in the event the second associated output does not match the second known output:
   storing indicia of the second associated output;
   causing the electronic circuit to appear to assume the associated circuit input state associated with the test pattern associated with the second known output; and
   proceeding with additional test procedures.

3. The method of claim 1, further comprising, in the event the first associated output does not match the first known output, identifying a failing portion of the electronic circuit based on the first associated output and the first known output.

4. The method of claim 1, wherein selecting a first log interval comprises selecting the first log interval based on input from a user.

5. The method of claim 1, wherein each associated output comprises a data compacted signature.

6. The method of claim 5, wherein modifying the first associated output to match the first known output comprises loading data into a multiple-input shift register (MISR) so as to configure the MISR to generate the first known output.

7. The method of claim 1, wherein storing indicia of the first associated output comprises setting a fail flag in an array representing the plurality of test patterns.

8. The method of claim 1, wherein storing indicia of the first associated output comprises storing an output signature of the first associated output.

9. A system, comprising:
   a test engine coupled to a device under test (DUT), the DUT comprising a plurality of test stumps;
   the test engine configured to:
   generate a plurality of test patterns arranged in an order, wherein each test pattern is associated with an associated circuit input state, and each test pattern causes an associated output of the DUT; and
   apply to an electronic circuit a first subset range of the plurality of test patterns sequentially in the order, from a first test pattern to a first log interval after the first test pattern, thereby generating a first associated output;

a trace array coupled to the DUT and configured to:
  store a plurality of known outputs, wherein the plurality of known outputs comprises a known output associated with each test pattern as applied to an electronic circuit configured similar to the DUT and functioning in a known state;
a controller coupled to the test engine and the trace array and configured to compare the first associated output with a first known output of the plurality of known outputs, wherein the first known output is associated with the same test pattern as the first associated output; and
the test engine further configured to:
  in the event the first associated output matches the first known output, proceed with additional test procedures; and
  in the event the first associated output does not match the first known output:
    store indicia of the first associated output;
    modify the first associated output to match the first known output; and
    proceed with additional test procedures.

10. The system of claim 9, wherein proceeding with additional test procedures comprises:
  in the event a last-run test pattern is not a last test pattern in the plurality of test patterns:
  testing the DUT in a second test by:
    applying to the electronic circuit
      a second subset range of the plurality of test patterns sequentially in the order, from a first test pattern after a last-run test pattern to the first log interval after the first test pattern, thereby generating a second associated output;
    comparing, by the controller, the second associated output with a second known output of the plurality of known outputs, wherein the second known output is associated with the same test pattern as the second associated output;
    in the event the second associated output matches the second known output, proceeding with additional test procedures; and
    in the event the second associated output does not match the second known output:
      storing indicia of the second associated output;
      causing the electronic circuit to appear to assume the associated circuit input state associated with the test pattern associated with the second known output; and
      proceeding with additional test procedures.

11. The system of claim 9, wherein modifying the first associated output to match the first known output comprises loading data into a multiple-input shift register (MISR) so as to configure the MISR to generate the first known output.

12. The system of claim 9, wherein the test engine is further configured to select the first log interval based on input from a user.

13. The system of claim 9, wherein storing indicia of the first associated output comprises setting a fail flag in an array representing the plurality of test patterns.

14. A processor comprising a computer program product for testing an electronic circuit, the computer program product having a tangible computer-readable medium with a computer program embodied thereon, the computer program comprising:
  computer code for selecting a plurality of test patterns arranged in an order, wherein each test pattern is associated with an associated circuit input state, and each test pattern causes an associated output of an electronic circuit;
  computer code for selecting a first log interval;
  computer code for storing a plurality of known outputs, wherein the plurality of known outputs comprises a known output associated with each test pattern as applied to the electronic circuit functioning in a known state;
  computer code for testing the electronic circuit in a first test by applying to the electronic circuit a first subset range of the plurality of test patterns sequentially in the order, from a first test pattern to the first log interval after the first test pattern, thereby generating a first associated output;
  computer code for comparing the first associated output with a first known output of the plurality of known outputs, wherein the first known output is associated with the same test pattern as the first associated output;
  computer code for, in the event the first associated output matches the first known output, proceeding with additional test procedures; and
  computer code for, in the event the first associated output does not match the first known output:
    storing indicia of the first associated output;
    modifying the first associated output to match the first known output; and
    proceeding with additional test procedures.

15. The processor of claim 14, wherein proceeding with additional test procedures comprises:
  in the event a last-run test pattern is not a last test pattern in the plurality of test patterns:
  testing an electronic circuit in a second test by:
    applying to the electronic circuit
      a second subset range of the plurality of test patterns sequentially in the order, from a first test pattern after a last-run test pattern to the first log interval after the first test pattern, thereby generating a second associated output;
    comparing the second associated output with a second known output of the plurality of known outputs, wherein the second known output is associated with the same test pattern as the second associated output;
    in the event the second associated output matches the second known output, proceeding with additional test procedures; and
    in the event the second associated output does not match the second known output:
      storing indicia of the second associated output;
      causing the electronic circuit to appear to assume the associated circuit input state associated with the test pattern associated with the second known output; and
      proceeding with additional test procedures.

16. The processor of claim 14, wherein modifying the first associated output to match the first known output comprises loading data into a multiple-input shift register (MISR) so as to configure the MISR to generate the first known output.

17. The processor of claim 14, wherein selecting a first log interval comprises selecting the first log interval based on input from a user.

18. The processor of claim 14, wherein the plurality of test patterns comprises LBIST test patterns.

19. The processor of claim 14, wherein storing indicia of the first associated output comprises setting a fail flag in an array representing the plurality of test patterns.

20. The processor of claim 14, wherein storing indicia of the first associated output comprises storing an output signature of the first associated output.

* * * * *